(12) United States Patent
De Santis et al.

(10) Patent No.: US 9,343,155 B1
(45) Date of Patent: May 17, 2016

(54) MEMORY AS A PROGRAMMABLE LOGIC DEVICE

(71) Applicant: Micron Technology, Inc., Boise, ID (US)

(72) Inventors: Luca De Santis, Avezzano (IT); Tommaso Vali, Sezze (IT); Kenneth J. Eldredge, Boise, ID (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 13/774,636

(22) Filed: Feb. 22, 2013

Related U.S. Application Data

(60) Provisional application No. 61/602,249, filed on Feb. 23, 2012.

(51) Int. Cl.
*G11C 16/04* (2006.01)
*G11C 16/10* (2006.01)
*G11C 16/34* (2006.01)

(52) U.S. Cl.
CPC ............ *G11C 16/10* (2013.01); *G11C 16/0483* (2013.01); *G11C 16/3418* (2013.01)

(58) Field of Classification Search
CPC ............... G11C 16/0483; G11C 16/10; G11C 16/3418; G11C 16/26; H01L 27/115
USPC ..................................................... 365/185.7
See application file for complete search history.

(56) References Cited

U.S. PATENT DOCUMENTS

2012/0176841 A1* 7/2012 Lee et al. ................. 365/185.17

* cited by examiner

*Primary Examiner* — Jason Lappas
(74) *Attorney, Agent, or Firm* — Dicke, Billig & Czaja, PLLC

(57) ABSTRACT

Methods for programming, methods for operating, and memories are disclosed. One such method for programming includes programming a group of memory cells such that a series string of memory cells of the group of memory cells is programmed to provide a logical function responsive to an input minterm whose variables are coupled to respective, associated memory cells.

11 Claims, 12 Drawing Sheets

| WL0 | WL1 | $V_{th0}$ | $V_{th1}$ | I |
|---|---|---|---|---|
| $V_{R0}$ | $V_{R1}$ | PGM | ERASED | OFF |
| $V_{R0}$ | $V_{R1}$ | ERASED | PGM | ON |
| $V_{R1}$ | $V_{R0}$ | PGM | ERASED | ON |
| $V_{R1}$ | $V_{R0}$ | ERASED | PGM | OFF |

$Y = Y1 + Y2 + Y3 + Y4' + Y4''$
$Y = G1 \cdot \overline{C}D + G2 \cdot \overline{C} + G3 \cdot C\overline{D} + G4 \cdot \overline{CD} + G4 \cdot CD$
$Y = \overline{ABCD} + \overline{ABC}D + \overline{AB}C\overline{D} + ABCD$

US 9,343,155 B1

MEMORY AS A PROGRAMMABLE LOGIC DEVICE

RELATED APPLICATION

This application is a non-provisional of provisional application U.S. Ser. No. 61/602,249, filed Feb. 23, 2013, titled "MEMORY AS A PROGRAMMABLE LOGIC DEVICE," and related to provisional application U.S. Ser. No. 61/476,574, filed Apr. 18, 2011, titled "METHODS AND APPARATUS FOR PATTERN MATCHING" commonly assigned.

TECHNICAL FIELD

The present embodiments relate generally to memory and a particular embodiment relates to using a memory device as a programmable logic device.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line.

Content addressable memories (CAM) are memories that implement a lookup table function in a single clock cycle. They use dedicated comparison circuitry to perform the lookups. CAM applications are often used in network routers for packet forwarding and the like. Each individual memory in a CAM requires its own comparison circuit in order to allow the CAM to detect a match between a bit of the key word with a bit stored in the CAM. Typical CAM cells, then, use approximately nine to ten transistors for a static random access memory (SRAM)-based CAM, or four to five transistors for a dynamic random access memory (DRAM)-based CAM.

NAND flash memory can be used in a CAM scheme to provide a pattern matching function. For example, patterns can be matched by comparing key word data with data stored in the memory array. The CAM matching scheme can also be used by programmable logic devices (PLDs) like programmable logic arrays (PLAs) and programmable array logic (PAL).

For a memory device to effectively realize a logic function of $2^m \rightarrow n$, where m is the address cardinality and n is the output cardinality, the function mapping should be exhaustive. In other words, for each input value a word should be stored in memory. PLDs have been used to implement functions but they can typically only be programmed with minterms (i.e., a logical expression that employs only the complement operator and the conjunction operator) of the programmed logic function due to their limited output size. Additionally, PLDs typically are not reprogrammable. Once programmed, they must be discarded if the programmed functions are changed.

For the reasons stated above and for other reasons that will become apparent to those skilled in the art upon reading and understanding the present specification, there is a need in the art for a PLD that can implement a large quantity of logic functions.

DETAILED DESCRIPTION

Figure 1:
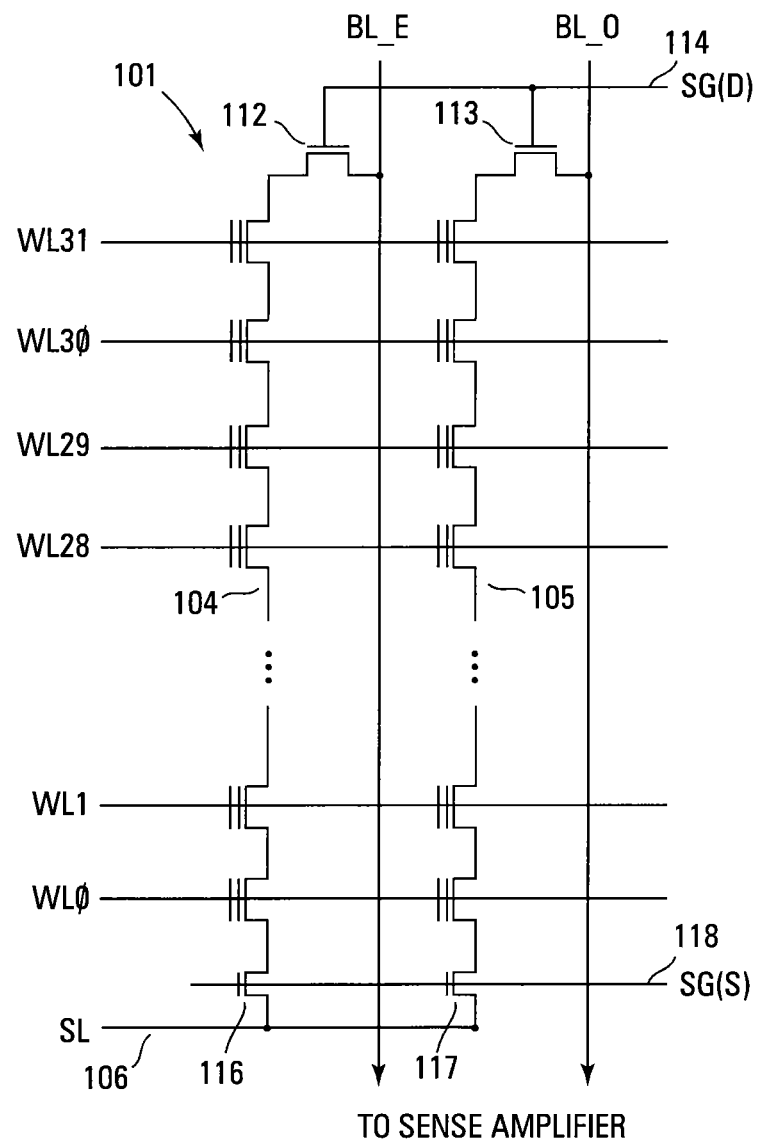
FIG. 1 shows a schematic diagram of one embodiment of a portion of a NAND memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101 comprising series strings of non-volatile memory cells. The present embodiments of the memory array are not limited to the illustrated NAND architecture.

The memory array 101 comprises an array of non-volatile memory cells (e.g., floating gate) arranged in columns such as series strings 104, 105. Each of the cells is coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry that detects the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

In a typical prior art programming of the memory array, each memory cell is individually programmed as either a single level cell (SLC) or a multiple level cell (MLC). The prior art uses a cell's threshold voltage ($V_t$) as an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional flash cell by assigning a bit pattern to a specific $V_t$ range.

As the architecture name indicates, NAND non-volatile memory behaves like a logical NAND function. When all cells in a series string are in a conductive state, a current path to ground discharges the bit line. When at least one of the memory cells of the series string is not in a conductive state, the bit line does not discharge but remains precharged.

Figures 2A, 2B:
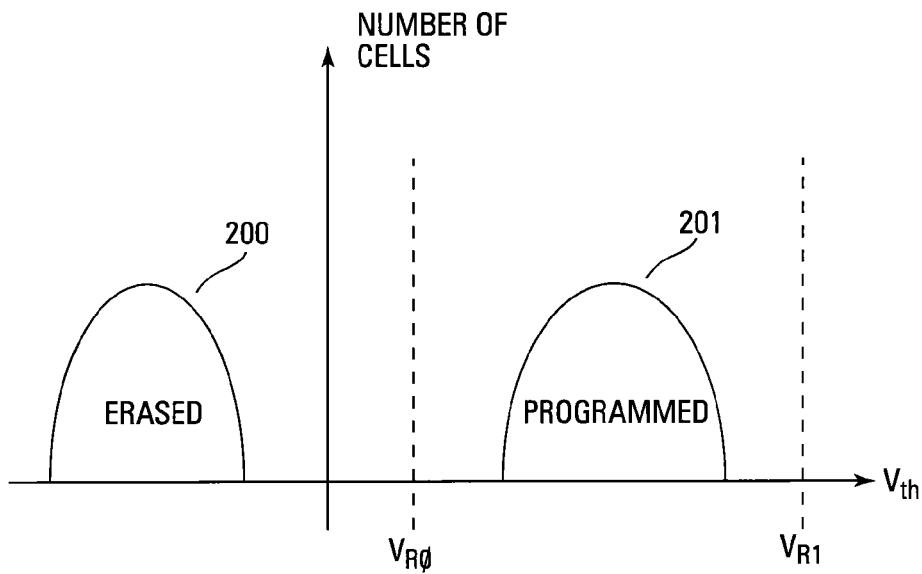
FIGS. 2A and 2B show programmed and erased distributions and an associated table of read voltages with their resulting threshold voltages and current flow.

FIG. 2A illustrates a distribution diagram for two memory cell distributions 200, 201 that represent an erased state 200 and a programmed state 201 for non-volatile memory cells. The diagram also illustrates read voltages $V_{R0}$ and $V_{R1}$.

Read voltage $V_{R0}$ is a lower read voltage. When this voltage is used to bias a word line, only those memory cells coupled to the word line having a threshold voltage less than or equal to $V_{R0}$ will be activated. Thus, only the memory cells in the erased state will be activated.

Read voltage $V_{R1}$ is a higher read voltage than $V_{R0}$. When this voltage is used to bias a word line, all the cells coupled to the word line having a threshold voltage less than or equal to $V_{R1}$ will be activated. Thus, both the memory cells in the erased state and the memory cells in the programmed state will be activated.

FIG. 2B illustrates a table that corresponds to distributions and read voltages $V_R$ of FIG. 2A. The table includes read voltage $V_R$ that can be either $V_{R0}$ or $V_{R1}$. The threshold voltage $V_{th}$ is illustrated as being either ERASED or PGM depending on in which state the memory cell is in. The current I of the bit line is listed as either ON or OFF.

The table of 2B shows that when $V_R$ is equal to $V_{R0}$, the current is ON when the memory cells are erased. When $V_R$ is equal to $V_{R0}$, the current is OFF when the memory cells are programmed. When $V_R$ is equal to $V_{R1}$, both the erased memory cells and the programmed memory cells produce an ON current. The table of FIG. 2B thus shows a basic NAND function truth table.

Figures 3A, 3B:
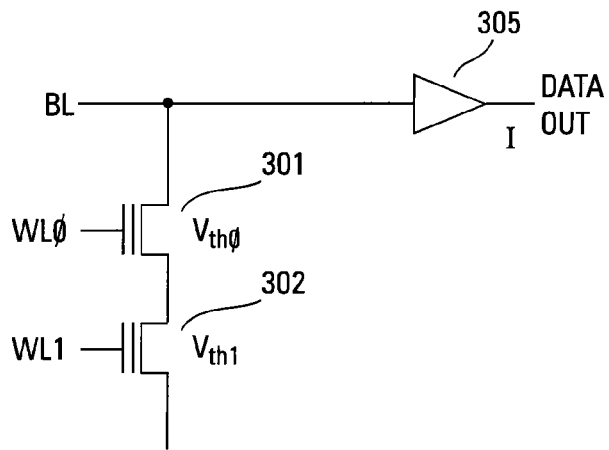
FIGS. 3A and 3B show a schematic of two memory cells and an associated table of read voltages with their resulting threshold voltages and current flow.

FIGS. 3A and 3B show the basic programmable logic function of a pair of memory cells 301, 302. The circuit of FIG. 3A, for the purposes of clarity, illustrates only a pair of memory cells 301, 302 of a series string of memory cells. For the subsequent discussion, both for FIGS. 3A, 3B and subsequent embodiments, it is assumed that pairs of adjacent memory cells of at least one group of memory cells (e.g., memory block) are programmed in complementary states. For example, if the top memory cell 301 is programmed, the bottom memory cell 302 is erased. If the bottom memory cell 302 is programmed, the top memory cell 301 is erased. The next distinct pair of adjacent memory cells in the string can also be programmed in complementary states. For example, the top memory cell in the next pair of adjacent memory cells may be erased, while the bottom memory cell in the next pair may be programmed. Alternatively, the top memory cell in the next pair of adjacent memory cells may be programmed, while the bottom memory cell in the next pair may be erased. Accordingly, although adjacent memory cells in a pair are programmed in complementary states, adjacent memory cells between two distinct pairs are not necessarily programmed in complementary states.

Similarly, it is assumed for the subsequent discussion that the word line voltages are applied in a complementary fashion. For example, if word line WL0 has a higher read voltage then WL1 has a lower read voltage. If word line WL1 has the higher read voltage then WL0 has the lower read voltage.

The top memory cell 301 has a control gate that is coupled to WL0 and has a threshold voltage of $V_{th0}$. The bottom memory cell 302 has a control gate that is coupled to WL1 and has a threshold voltage of $V_{th1}$.

A bit line is shown coupled to the drain connection of the top memory cell 301. Sense circuitry 305 (e.g., sense amplifier) is coupled to the bit line. The output of the sense circuitry 305 is considered the data out for the circuit and includes the current I.

FIG. 3B illustrates a table in accordance with the circuit of FIG. 3A. This table lists the read voltages $V_R$ on word lines WL0 and WL1, the threshold voltages $V_{th0}$ and $V_{th1}$, and whether the current I is ON or OFF. The read voltages can be either $V_{R0}$ or $V_{R1}$, as illustrated in FIG. 2A. Thus, as shown in FIG. 2A, $V_{R0}$ is assumed to be the lower read voltage while $V_{R1}$ is assumed to be the higher read voltage.

The table of FIG. 3B shows that when $V_{R0}$ is applied to WL0, $V_{R1}$ is applied to WL1, the top memory cell 301 is programmed and the bottom memory cell 302 is erased, the current I is OFF. When $V_{R0}$ is applied to WL0, $V_{R1}$ is applied to WL1, the top memory cell 301 is erased and the bottom memory cell 302 is programmed, the current I is ON. When $V_{R1}$ is applied to WL0, $V_{R0}$ is applied to WL1, the top memory cell 301 is programmed and the bottom memory cell 302 is erased, the current I is ON. When $V_{R1}$ is applied to WL0, $V_{R0}$ is applied to WL1, the top memory cell 301 is erased and the bottom memory cell 302 is programmed, the current I is OFF. With this mechanism, the basic cell of a CAM matching circuit is realized.

Figure 4:
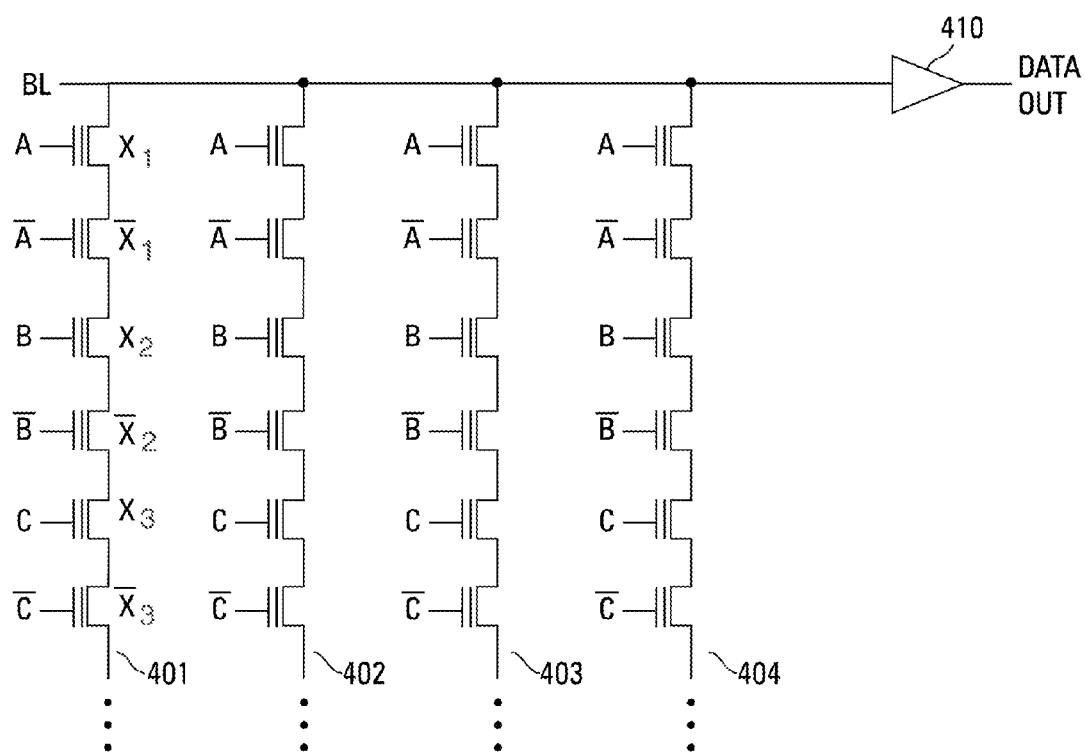
FIG. 4 shows a schematic of series strings of memory cells in accordance with a logic building function.

FIG. 4 expands on the concept disclosed in FIG. 3. FIG. 4 illustrates a schematic diagram of one embodiment of a plurality of strings of memory cells 401-404. The word line read voltages are now represented by logic variables A/$\overline{A}$, B/$\overline{B}$, and C/$\overline{C}$. An erased memory cell is subsequently represented by a logical 0 and a programmed memory cell is subsequently represented by a logical 1. The threshold voltages are represented by $X_n$ for each memory cell. Sense circuitry 410 is coupled to the bit line BL that is coupled to all of the series strings of memory cells 401-404.

As is well known in the art, a minterm is the result of a logical AND of at least two terms. The embodiment of FIG. 4 provides a logical sum of minterms (e.g., $X_n$) that represent the threshold voltage for each memory cell. In other words, each series string can be programmed to provide a logical NAND function, where coupling the series strings to the bit line logically OR's the series string functions together. The output function of the circuit of FIG. 4 can be written as Data Out=F(A,B,C,D)=$\Sigma_i X_1^i \cdot X_2^i \ldots X_n^i$ where $X_1^i$ can be A or $\overline{A}$, $X_2^i$ can be B or $\overline{B}$, $X_3^i$ can be C or $\overline{C}$, and $X_4^i$ can be D or $\overline{D}$ wherein "i" is the number of series strings in the block. This pattern can be continued indefinitely.

The size of the functions of the present NAND memory device as a PLD are limited only by the length of the series string. For example, if the series string of memory cells comprises 64 memory cells, the series string can be programmed with a function of 32 bits comprising the variable and its complement. Each memory block of the memory device can be programmed with one or more of these programmed functions.

Figure 5:
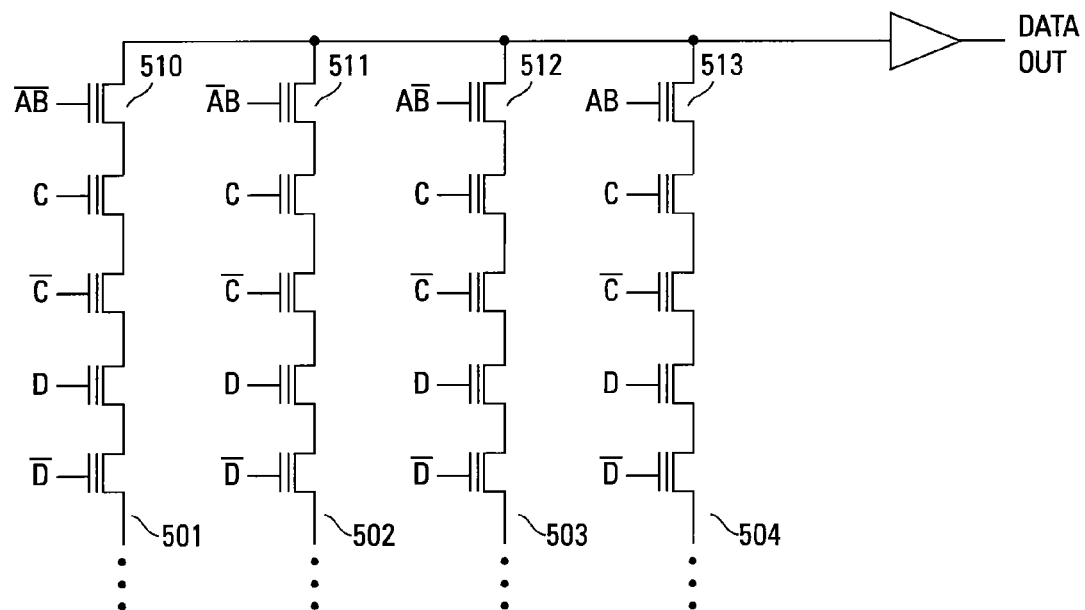
FIG. 5 shows a schematic diagram of series strings of memory cells in accordance with extended logic functions.

FIG. 5 illustrates a schematic diagram of one embodiment of a way to extend the length of the logical functions of FIG. 4. A logical function result of one memory block can be used as an input to a second memory block. This can be extended for the number of blocks that are present in the memory device.

FIG. 5 illustrates four series strings of memory cells 501-504 that, like the embodiment of FIG. 4, can be programmed to provide programmable logic NAND functions that are then logically OR'd by coupling the strings through select gate drain transistors to the bit line.

In the embodiment of FIG. 5, at least one of the memory cells 510-513 of each series string 501-504 uses the logical function result of another series string of memory cells as an input to at least one memory cell of each series string. For example, one memory cell 510 might have $\overline{AB}$ as an input, another memory cell 511 might have $\overline{A} B$ as an input, another memory cell 512 might have A $\overline{B}$ as an input, and another memory cell 513 might have AB as an input. By programming one or more of these memory cells 510-513, that memory cell's respective minterm can be included in the logical function. Any of these minterms can also be excluded by leaving its respective memory cell 510-513 in the erased state. Thus, a memory cell of each series string of memory cells 501-504 can be programmed with a different logical function result. The data out of the circuit of FIG. 5 can then be a single bit, logically OR'd result of the series strings of memory cells as a function of the logical function result of other series strings not within the present memory block. This operation can be described mathematically, using the equation for F(A,B,C,D) above, as F(A,B,C,D)=$G_1$(A,B)·$H_1$(C,D)+$G_2$(A,B)·$H_2$(C,D) . . . , where G and H are the minterms that result from another logical function of another series string not within the present memory block.

For purposes of clarity, FIG. 5 shows only one memory cell of each series string 501-504 as having the results of another series string of memory cells as an input. Alternate embodiments can extend this scheme to more than one memory cell. Additionally, the logical function result of a memory block can also be used as an input to other memory cells.

Figure 6:
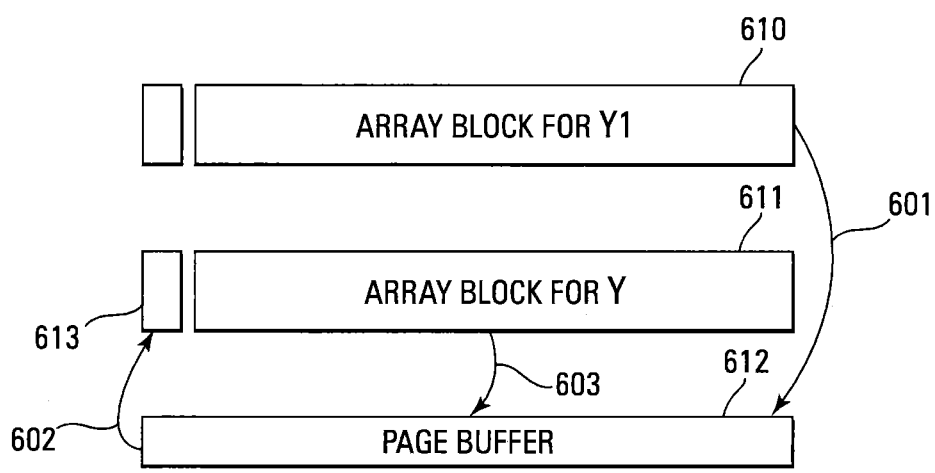
FIG. 6 shows a block diagram of one embodiment of a method for implementing the extended logic functions in accordance with FIG. 5.

The embodiment of FIG. 5 can be implemented using the method illustrated in the block diagram of FIG. 6. Using the same variables of FIG. 5, it is assumed that the function of the array block for Y1 610 is Y1=F(A, B) and the function of the array block for Y 611 is Y=F(Y1, C, D).

After the function result Y1 is determined, it is written 601 (e.g., stored) into a page buffer 612. The function result Y1 is then read 602 from the page buffer 612 to an x-axis shift register 613 for the array block for Y 611. The function result Y1 is shifted into the array block for Y 611 and used in the logical function of Y. The function result from the array block for Y 611 is then stored 603 into the page buffer 612 for either outputting or to be used in yet another function block (not shown). This can be repeated any number of times.

Figure 8A:
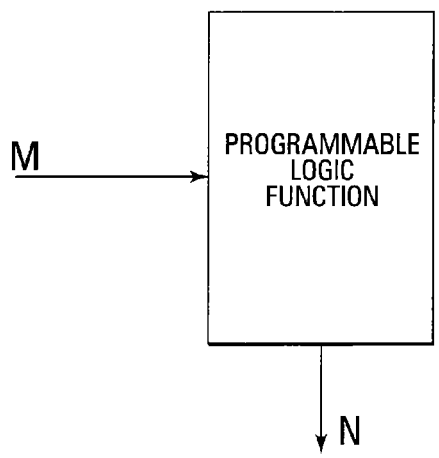
FIGS. 8A and 8B show one embodiment of a programmable logic function block and one embodiment of a resulting logical partition of memory.

FIG. 8A illustrates a programmable logic function block that has an M input and an N output. The size of the N output does not necessarily agree with the M input. In other words, an input variable having size M can be operated on by the programmable logic function and result in an output variable having a size N that is larger or smaller than M.

Figure 8B:
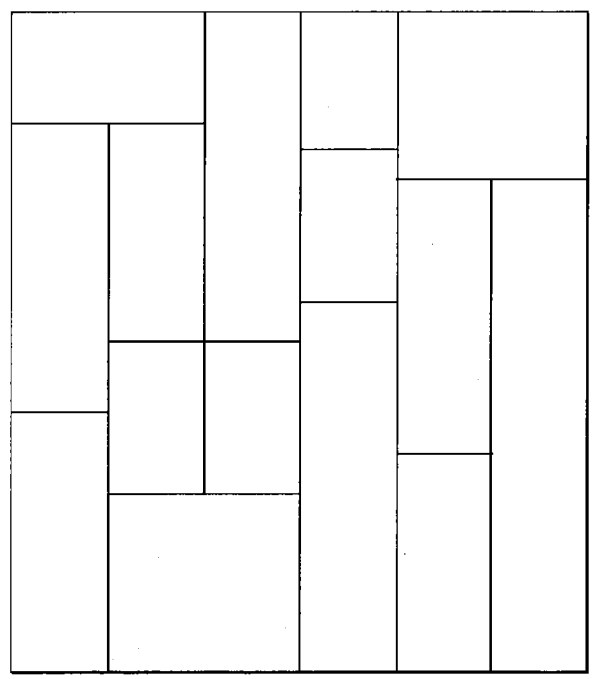

FIG. 8B illustrates a block diagram of one embodiment of a logical partition of memory as a result of the programmable logic function of 8A. Assuming M is in the vertical dimension and N is in the horizontal direction, it can be seen that the logic function can result in a logical partition that is divided into logic areas having different M/N sizes.

Figure 7:
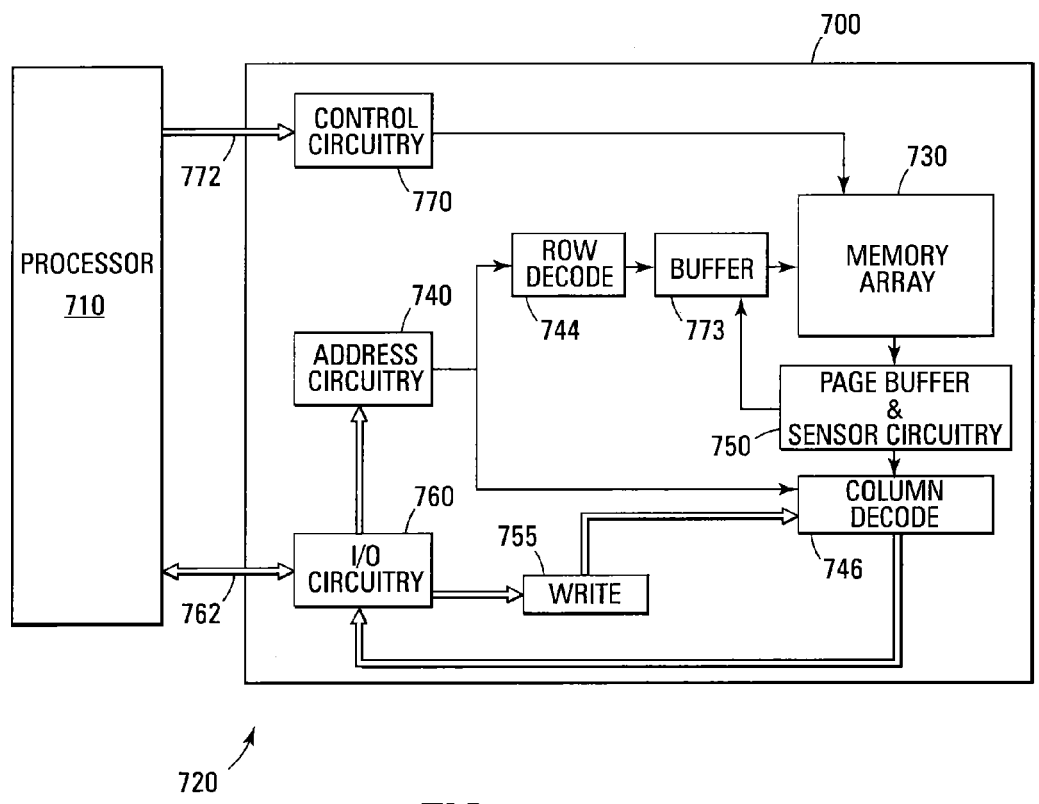
FIG. 7 shows a block diagram of one embodiment of a system that can incorporate a memory device using the described methods for sense operations.

FIG. 7 illustrates a functional block diagram of a memory device 700 that can comprise a memory array architecture such as illustrated in FIG. 1 and can be used as a PLD as disclosed herein. The memory device 700 is coupled to an external controller 710 or other external circuitry that uses a PLD. The external controller 710 may be a microprocessor or some other type of controller. The memory device 700 and the external controller 710 form part of a system 720.

The memory device 700 includes an array 730 of memory cells (e.g., NAND architecture non-volatile memory cells). The memory array 730 is arranged in banks of word line rows and bit line columns. In one embodiment, the columns of the memory array 730 comprise series strings of memory cells.

Address buffer circuitry 740 is provided to latch address signals provided through I/O circuitry 760. Address signals are received and decoded by a row decoder 744 and a column decoder 746 to access the memory array 730. A row buffer 773 can be used to buffer data prior to input to the memory array 730.

The memory device 700 reads data in the memory array 730 by sensing voltage or current changes in the memory array columns using sense circuitry/page buffers 750. The sense circuitry 750, in one embodiment, is coupled to read and latch a row of data from the memory array 730. The sense circuitry 750, as previously described, includes the sense circuitry as well as other circuits (e.g., page buffers) for performing a program verify operation. The sense circuitry/page buffers 750 can move data to the row buffer 773 as well. Data are input and output through the I/O circuitry 760 for bidirectional data communication as well as the address communication over a plurality of data connections 762 with the controller 710. Write circuitry 755 is provided to write data to the memory array.

An internal controller (e.g., control circuitry and/or firmware) 770 decodes signals provided on a control interface 772 from the external controller 710. These signals are used to control the operations on the memory array 730, including data read, data write (program), and erase operations. The internal controller 770 may be a state machine, a sequencer, or some other type of controller to generate the memory control signals. In one embodiment, the internal controller 770 is configured to control programming of the memory cells in order to act as a PLD.

The memory device illustrated in FIG. 7 has been simplified to facilitate a basic understanding of the features of the memory. A more detailed understanding of internal circuitry and functions of flash memories are known to those skilled in the art.

Figure 9A:
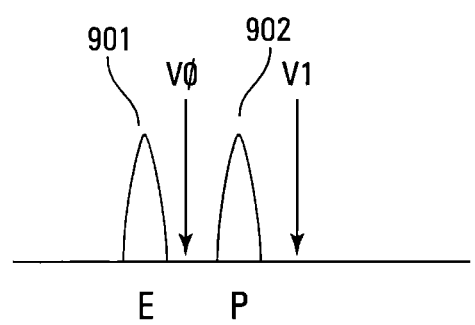
FIGS. 9A, 9B, and 9C show one example of the programming of a logic function to a memory device.
Figure 9B:
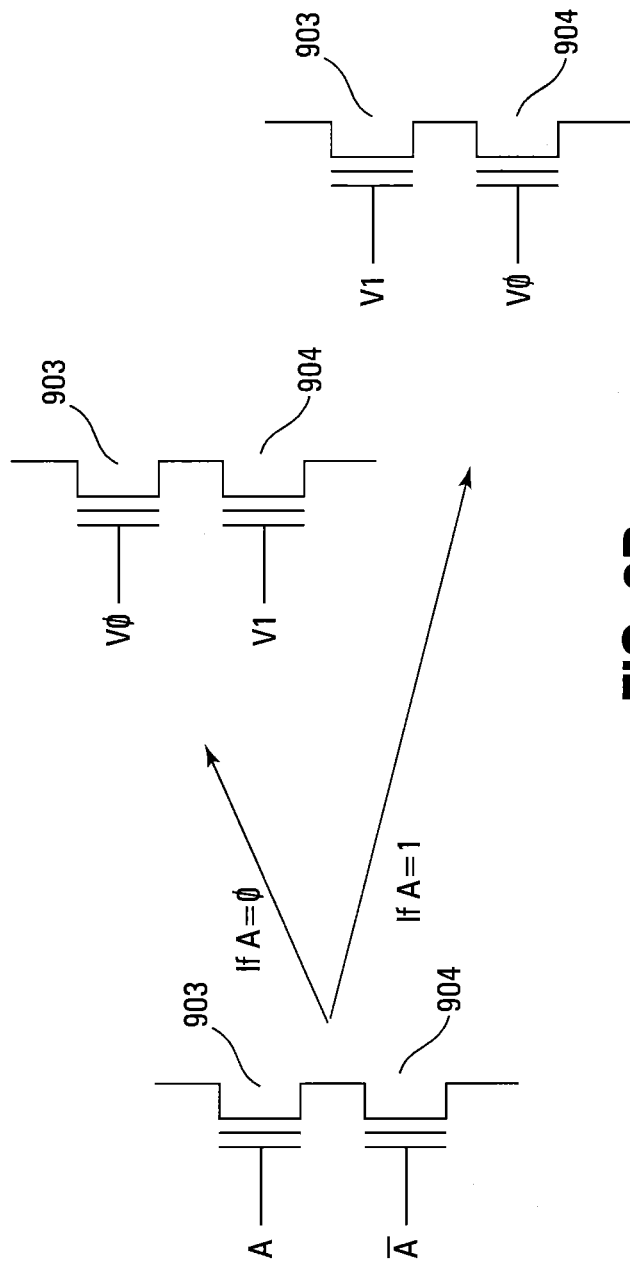
Figure 9C:
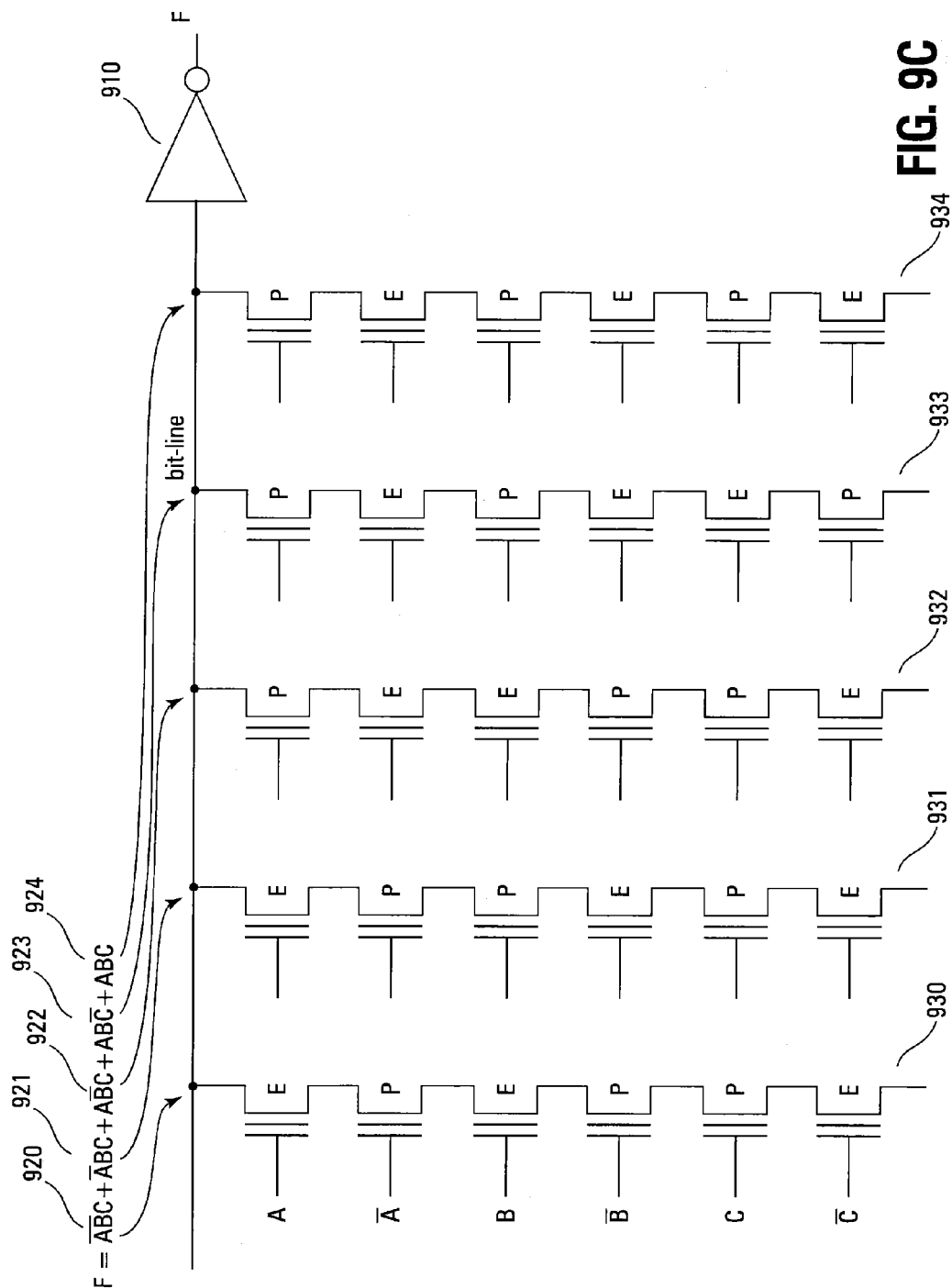

FIGS. 9A-9C illustrate one example of operation for programming a logical function into a memory device, as discussed previously. These figures are for purposes of illustration only and do not limit the described embodiments to only this example.

FIG. 9A illustrates one basic premise assumed to be true for this example. This figure illustrates one distribution of memory cell threshold voltages as an erased stated 901 and a second distribution of memory cell threshold voltages as a programmed state 902. Thus, as used subsequently, "E" refers to the erased state 901 and "P" refers to the programmed state 902.

Voltages V0 and V1 in FIG. 9A can be verify voltages that are applied to the control gates of memory cells to determine if they have been programmed or are still erased. A string of memory cells will conduct when all complementary pairs of memory cells of the string are as follows: the programmed memory cells are biased with V1 and the erased memory cells are biased with either V0 or V1.

FIG. 9B illustrates another basic premise for this example that relates to the voltages V0 and V1 of FIG. 9A and a complementary pair of memory cells with A and $\overline{A}$ on the control gates. This figure illustrates that a computation is performed by applying the input variable to the control gate (e.g., word line coupled to the control gate) as follows: if the variable A is logic 0, apply V0 to the first memory cell 903 and V1 to the second memory cell 904; if the variable A is a logic 1, apply V1 to the first memory cell 903 and V0 to the second memory cell 904.

FIG. 9C illustrates how the function $F=\overline{ABC}+\overline{A}BC+A\overline{BC}+AB\overline{C}+ABC$ is programmed to a memory device. Each logically OR'd term (e.g., ABC) 920-924 represents a different memory cell string 930-934 as shown in FIG. 9C. The function output F is the output of the inverter 910 that is coupled to the bit line shared by all of the memory cell strings 930-934.

FIG. 9C shows that the $\overline{ABC}$ term 920 is programmed into the first string of memory cells 930. Since both the A and B variables are negated (e.g., $\overline{A}$ and $\overline{B}$), the $\overline{A}$ and $\overline{B}$ memory cells of the respective complementary pairs are shown as programmed (P) while the remaining A and B true memory cells of each pair are shown as erased (E). The C variable is true and, thus, the C memory cell is programmed (P) while the $\overline{C}$ memory cell is erased (E).

The remaining logic function F terms 921-924 are programmed into their respective memory cell strings 931-934 in a substantially similar way. The bit line then logically OR's these terms and outputs the result as the logic function output F.

Figure 10:
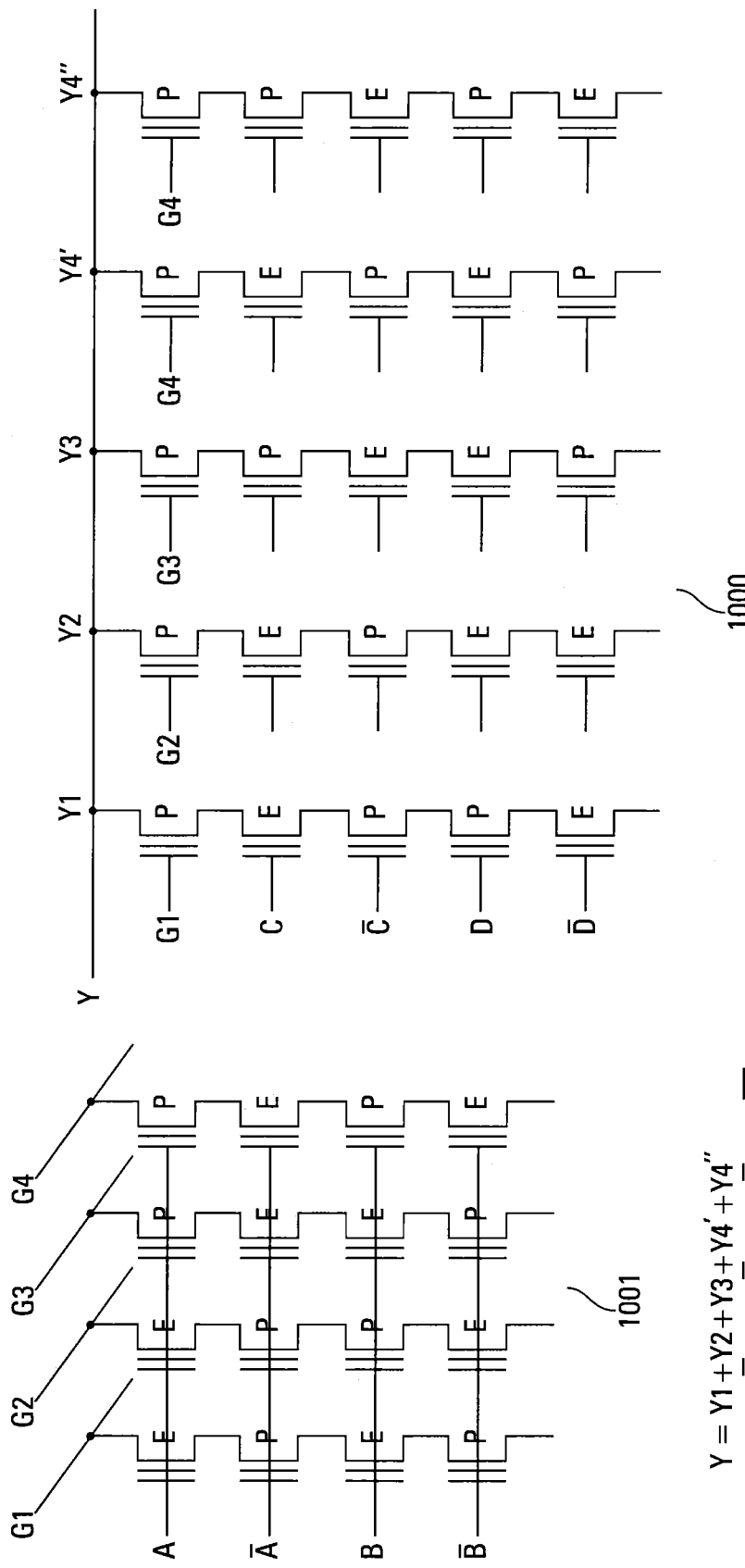
FIG. 10 shows one example of the programming of a logic function to a memory device in accordance with FIG. 5.

FIG. 10 illustrates one example of the embodiments of FIGS. 5 and 6 using multiple variables to extend the length of logic functions. The example takes the functional results of a plurality of series strings of memory cells 1001 and uses the results of each series string as an input to another group of memory cells 1000. Each of the plurality of series strings 1001 is coupled to a different bit line to produce a different minterm (e.g., G1-G4). Thus, each different bit line can be from a different memory block or one memory block with a plurality of bit lines. In the illustrated example, the second group of memory cells is used as the final functional output Y.

The functional output Y equals the logically OR'd result of each of the series strings coupled to the bit line of Y. For example, the different series strings are labeled Y1, Y2, Y3, Y4', and Y4". Thus, Y=Y1+Y2+Y3+Y4'+Y4".

Using the same programmed (P) and erased (E) nomenclature of the example of FIG. 9, it can be seen that Y1=G1 $\overline{C}$ D, Y2=G2 $\overline{C}$ (D/$\overline{D}$ is a do not care variable since it is not enabled), Y3=G3C $\overline{D}$, Y4'=G4 $\overline{CD}$, and Y4"=G4CD. Thus, the logical function Y=G1 $\overline{C}$ D+G2 $\overline{C}$+G3C $\overline{D}$+G4 $\overline{CD}$+G4CD.

The first group of memory cells 1001 shows four sets of memory cell strings, each coupled to a different bit line that are denoted as G1, G2, G3, and G4. The inputs to the memory cells of each of these series strings are the complementary inputs A/$\overline{A}$ and B/$\overline{B}$. Using the same programmed (P) and erased (E) nomenclature of the example of FIG. 9, it can be seen that G1=$\overline{AB}$, G2=$\overline{A}$ B, G3=A $\overline{B}$, and G4=AB. Using the embodiment of FIG. 6 to couple the functional results of G1, G2, G3, and G4 to their respective memory cells of their respective series strings of memory cells as seen in memory cell group 1000, the result is the final logical function Y= $\overline{ABCD}+\overline{ABC}+A\overline{BCD}+AB\overline{CD}+ABCD$.

While the complementary memory cells are shown in the above embodiments as being adjacent memory cells, there is no requirement that these cells be adjacent to each other. Alternate embodiments can simply include the complementary memory cells within the same string of memory cells.

CONCLUSION

In summary, one or more embodiments of a memory device are disclosed that can be configured as a programmable logic device. Since a NAND flash memory device is reprogrammable, when a function that is programmed into the memory device is updated, the memory device can simply be erased and reprogrammed with the new function. Also, unlike a typical PLD, a NAND flash memory device can be reprogrammed by a user.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for programming a group of memory cells, the method comprising:
    programming the group of memory cells such that a series string of memory cells of the group of memory cells is programmed to provide a logical function responsive to an input minterm;
    wherein the group of memory cells comprises a plurality of series strings of memory cells each selectively coupled to a same particular data line through a respective first select gate and each selectively coupled to a ground through a respective second select gate; and
    wherein each series string of memory cells of the plurality of series strings of memory cells is configured to commonly receive the input minterm while coupled to the same particular data line through their respective first select gates and while coupled to the ground through their respective second select gates.

2. The method of claim 1 wherein the group of memory cells is a memory block.

3. The method of claim 1 wherein pairs of memory cells of the series string of memory cells are programmed with complementary states.

4. The method of claim 3 wherein programming the group of memory cells comprises programming each of the plurality of series strings of memory cells to provide a respective NAND logical function, and further comprising coupling the plurality of series strings to the same particular data line to logically OR the NAND logical functions.

5. The method of claim 4 and further comprising programming all of the memory cells of each series string of memory cells such that each pair of adjacent memory cells is programmed with complementary states.

6. The method of claim 4 wherein each logical function comprises a plurality of variables such that a variable is enabled by a programmed memory cell and disabled by an erased memory cell.

7. The method of claim 5 wherein each series string of memory cells of the plurality of series strings of memory cells has control gates of their respective memory cells coupled to a same set of access lines.

8. The method of claim 4 and further comprising programming the memory cells of the series string of memory cells such that at least one pair of memory cells is programmed with complementary states to represent a variable of the logical function.

9. The method of claim 8 and further comprising programming the memory cells of the series string of memory cells such that at least one other pair of memory cells is programmed with erased states to disable another variable of the logical function.

10. The method of claim 1 wherein each series string of memory cells of the plurality of series strings of memory cells is coupled to receive a same set of voltages at control gates of their respective memory cells.

11. A method for programming a group of memory cells, the method comprising:

programming the group of memory cells such that a series string of memory cells of the group of memory cells is programmed to provide a logical function responsive to an input minterm;

wherein the group of memory cells comprises a plurality of series strings of memory cells each selectively coupled to a same particular data line through a respective first select gate and each selectively coupled to a ground through a respective second select gate;

wherein each series string of memory cells of the plurality of series strings of memory cells is configured to commonly receive the input minterm while coupled to the same particular data line through their respective first select gates and while coupled to the ground through their respective second select gates;

wherein the logical function comprises a plurality of variables; and wherein variables of the plurality of variables are each represented by a pair of memory cells of the series string of memory cells programmed to complementary data states.

\* \* \* \* \*